United States Patent [19]

Dietze et al.

[11] 3,962,391

[45] June 8, 1976

[54] DISC SUPPORT STRUCTURE AND METHOD OF PRODUCING THE SAME

[75] Inventors: Wolfgang Dietze, Munich; Richard Mittermeier, Moosburg; Gerhard Steinwagner, Munich, all of Germany

[73] Assignee: Siemens Aktiengesellschaft, Berlin & Munich, Germany

[22] Filed: Mar. 20, 1974

[21] Appl. No.: 452,934

[30] Foreign Application Priority Data

May 7, 1973 Germany............................ 2322952

[52] U.S. Cl. ................................. 264/81; 264/138; 264/159
[51] Int. Cl.² ..................... B29C 13/00; B29C 17/10
[58] Field of Search ............... 264/67, 81, 138, 159, 264/162

[56] References Cited
UNITED STATES PATENTS

| | | | |
|---|---|---|---|
| 3,157,718 | 11/1964 | O'Leary | 264/57 |
| 3,746,496 | 7/1973 | Dietze et al | 264/81 X |
| 3,747,559 | 7/1973 | Dietze | 264/81 X |
| 3,751,539 | 8/1973 | Reuschel | 264/81 |
| 3,807,979 | 4/1974 | Cromwell | 51/309 |

Primary Examiner—Robert F. White
Assistant Examiner—Thomas P. Pavelko
Attorney, Agent, or Firm—Hill, Gross, Simpson, Van Santen, Steadman, Chiara & Simpson

[57] ABSTRACT

A support structure composed of Si or SiC for supporting semiconductor crystal discs during annealing or doping thereof. A somewhat tube-shaped member having at least one flat side is formed by thermal deposition of a gaseous silicon compound onto a similarly shaped carrier member and the tube-shaped member is then cut and mechanically processed in directions parallel and perpendicular to the axes of the tube to form a support structure having a flat base and upwardly extending curved side walls.

5 Claims, 7 Drawing Figures

DISC SUPPORT STRUCTURE AND METHOD OF PRODUCING THE SAME

BACKGROUND OF THE INVENTION

1. Field of the Invention

The invention relates to disc support structures and means of producing the same and somewhat more particularly to Si or SiC support structures for supporting semiconductor crystal discs during processing thereof and a method of producing such structures.

2. Prior Art

Support structures composed of Si or SiC are required in semiconductor techniques to maintain crystal discs composed of a semiconductor material, such as silicon, in a position during a dopant diffusion or an annealing process of the discs. In the prior art, such support structures have been produced from solid silicon bodies, which is quite difficult and very expensive.

Methods of producing tubes or hollow bodies composed of semiconductor material by thermally induced gas deposition process are known. For example, German Offenlegungsschrift No. 2,125,085.1 (corresponding to U.S. Pat. No. 3,747,559), which is assigned to the instant assignee, discloses a process wherein a closed-end tube composed of silicon is produced by a thermally induced gas deposition process. In accordance with this process, a gas mixture of hydrogen and silico-chloroform is fed into a reaction chamber having a graphite carrier member therein which is heated up to the decomposition temperature of the silicon compound (about 1200° C.) so that the silicon compound decomposes and a deposit of silicon is formed about the carrier member. Upon removal of the carrier member without destruction of the deposit, a tube is attained. Such tubes have been used for supporting crystal discs during diffusion and/or annealing processes in accordance with semiconductor techniques.

SUMMARY OF THE INVENTION

The invention provides a means of simply and economically producing support structures composed of a silicon material, each of which are capable of holding a plurality of semiconductor discs therewithin for diffusion and/or annealing of the discs.

It is a novel feature of the invention to produce a tube member composed of a silicon material which has at least one flattened side wall by a thermally induced gas deposition process. Such flattened tube is deposited on a heated carrier member having at least one flattened side wall from a gas containing a thermally decomposable gaseous silicon compound. After formation, the tube is non-destructively removed from the carrier member and cut and/or mechanically processed in directions perpendicular and parallel to the tube axes to form a support structure which includes a flat base and upwardly extending curved walls.

It is a further novel feature of the invention to mechanically process a flattened tube composed of Si by sawing or grinding with a diamond cutting means.

Other and further objects of the present invention will be apparent from the following description and claims, and are illustrated in the accompanying drawings which, by way of illustration, show preferred embodiments of the present invention and the principles thereof and what is now considered to be the best mode contemplated for applying these principles. Other embodiments of the invention employing the same or equivalent principles may be used and structural changes may be made as desired by those skilled in the art without departing from the spirit and scope of the present invention.

DESCRIPTION OF THE PREFERRED EMBODIMENTS

Figure 1:
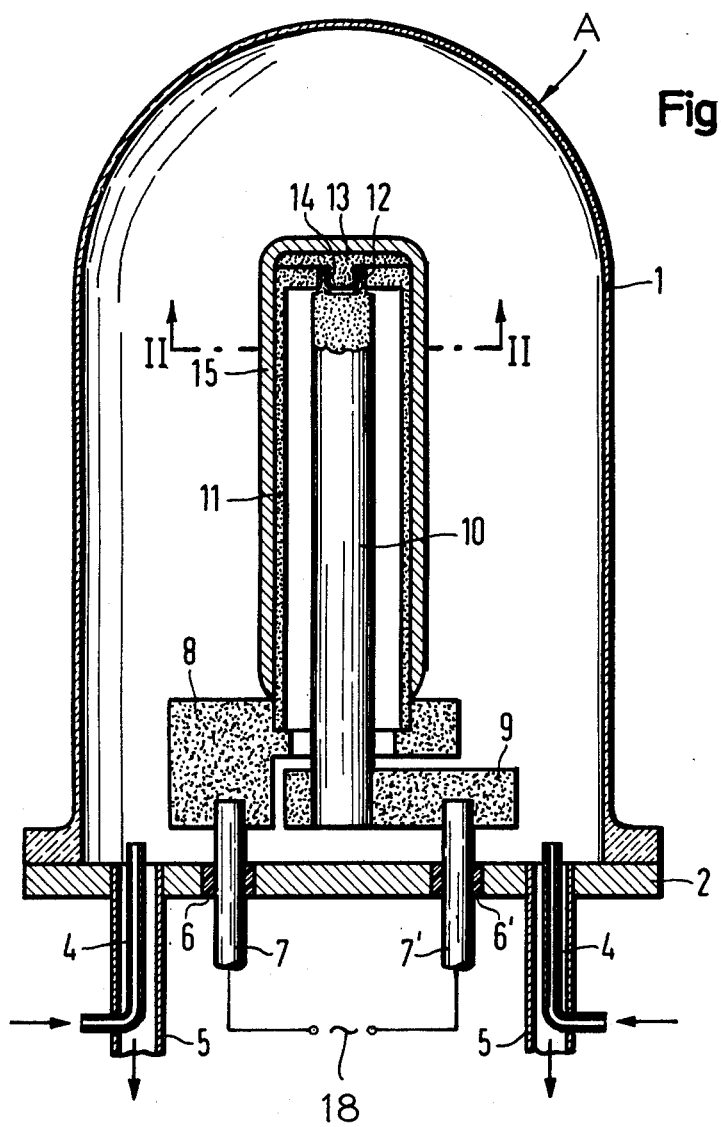
FIG. 1 is a side sectional view, with parts in elevation, of an embodiment of a device useful in producing flattened tubes in accordance with the principles of the invention.

The invention provides an economical support structure for discs and a relatively simple process of producing such structures.

In accordance with the principles of the invention, a somewhat ellipsoid-shaped tube member having at least one flattened wall is formed by a thermally induced gas deposition process and then cutting and/or mechanically processing parallelly and perpendicularly to the tube axis to attain a support structure having a flat base and upwardly extending curved side walls.

A support structure formed in accordance with the principles of the invention is capable of supporting or holding a plurality of semiconductor crystal discs, for example composed of silicon thereon so that such plurality of discs can be simultaneously subjected to a dopant diffusion and/or annealing process in a single operation.

A somewhat ellipsoid-shaped tube member is formed in accordance with the invention by depositing a silicon material from a gas containing a thermally decomposable gaseous silicon compound onto the peripheral surface of a heated somewhat ellipsoid-shaped carrier member having at least one flattened wall until a desired thickness of silicon material is uniformly attained about the carrier member. The carrier member is then removed, without destroying the formed ellipsoid-shaped tube, which is then mechanically processed into a support structure having a flat base and upwardly extending support walls.

The ellipsoid-shaped tubes of the invention are preferably mechanically processed or cut by sawing or grinding. The cutting is preferably accomplished with a diamond cutting means, such as one or more saw blades having diamond particles at their cutting edges or a grinding wheel or blade having diamond particles embedded therein.

In order to obtain a substantially uniform deposition of material, for example silicon, on all portions of a graphite carrier member, particularly at the flattened portions thereof, it is preferable to utilize a gas mixture comprised of a carrier gas such as hydrogen and a thermally decomposable gaseous silicon compound such as silico-chloroform (which decomposes at about 1200° C.) and deposit silicon material at a substantially fast deposition rate. With such a gas mixture it is possible to achieve a substantially uniform wall thickness on all sides of the tube being formed and it will be appreciated that a uniform wall thickness is very important for the subsequent mechanical processing steps. In preferred embodiments, a wall thickness of at least 1 mm is attained in the somewhat ellipsoid-shaped tube.

In accordance with the principles of the invention, one is able to simply and rationallly produce a support structure composed of Si which is shaped somewhat in the form of an elongated tub having an open top, a flat bottom wall and upwardly extending curved side walls integrally joined to the bottom wall and in opposing relation to one another. In certain embodiments of support structures formed in accordance with the principles of the invention, supporting struts or ribs are provided at spaced intervals along the side walls as extensions of areas of the side walls. The struts or ribs are dimensioned so as to have an upward reach which extends beyond the center of crystal discs to be supported within such support structures.

In accordance with a first exemplary embodiment of the invention, the height of support structure side walls is so dimensioned that a three-point mounting of crystal discs is achieved and each of the discs is in contact with a point on opposing side walls and a point on the bottom wall.

In accordance with a second exemplary embodiment of the invention, the height of support structure side walls is so dimensioned that a one-point mounting of discs results and each of the discs is in contact only with a point on the bottom wall. In these embodiments, the side walls of the support structures are lower in comparison to the side walls of support structures formed in accordance with the first exemplary embodiment. A primary function of such lower side walls is to prevent crystal discs from falling out of such support structures.

In accordance with a third exemplary embodiment of the invention, the height of support structure side walls is so dimensioned that a two-point mounting of discs results and each of the discs is in contact only with a point on opposite side walls.

In all of the exemplary embodiments, a movable block member composed of the same material as the support member, i.e., Si, may be provided to further secure crystal discs within the support member from tilting or tipping. The block member may be round or a flattened piece of, for example, silicon.

A particularly preferable embodiment of a support structure constructed in accordance with the principles of the invention is mechanically and thermally stable and comprises a support structure having spaced support struts along side walls thereof which are in the form of closed arches and have a flattened upper surface. These types of support structures are formed on graphite carrier members having opposing flattened sides joined to one another by curved sides or walls.

The silicon support structures of the invention are extremely well suited for diffusion and/or annealing of silicon crystals within silicon tubes or ampules because of their advantageous shape. The support structures are formed on graphite carrier members having a selected cross-section which insures a good fit of the support structures within processing tubes or ampules.

Referring now to the drawings, FIG. 1 illustrates a device A useful in forming support structures of the invention and which comprises a quartz dome 1 connected to a base plate 2, preferably composed of silver. A pair of gas inlet tubes 4 interconnect a source of gas (not shown) with the interior of dome 1 through base plate 2. A pair of gas outlet tubes 5 are coaxially mounted with inlet tubes 4 to direct residual gas away from the interior of dome 1. A pair of spaced-apart lead-in ducts 6 and 6', preferably composed of Teflon (a registered trademark for polytetrafluoroethylene) are provided within base plate 2 for mounting electrodes 7 and 7' through plate 2. The electrodes 7 and 7' are preferably composed of silver and are operationally connected to a voltage source 18. Support blocks 8 and 9 composed of graphite, are respectively mounted on the free ends of electrodes 7 and 7'. A somewhat ellipsoid-shaped hollow carrier member 11 having at least one flattened side wall 11a (best seen at FIG. 2) is positioned on support block 8 and a cylindrical rod 10 is positioned on support block 9. The carrier member 11 and rod 10 are preferably composed of graphite. A thread connection 12 is provided along adjacent upper surfaces of carrier member 11 and rod 10 so as to mechanically and electrically join the rod 10 with member 11. In order to provide a completely smooth end surface, a cap 13, also composed of graphite, is connected by a thread connection 14 along adjacent surfaces of a stem portion of cap 13 and rod 10.

Upon energization, rod 10 and carrier member 11 are heated to a desired temperature. Rod 10 emits radiant heat toward all portions of carrier member 11 and emits conductive heat toward the upper portion of member 11 so that the entire peripheral surface of member 11 and cap 13 are heated to a substantially uniform temperature and a layer or tube 15 is deposited on such heated peripheral surfaces. The deposition of, for example, silicon, takes place from a gas in a conventional manner, such as in the production of tubes or like of semiconductor material according to the so-called C-method. The gas comprises a mixture of a carrier gas, such as hydrogen, and a thermally decomposable gaseous silicon compound such as silicochloroform. Deposition of silicon takes place at temperatures in the range of about 1100° C. to 1200° C. and preferably at 1150° C.

After the deposition process, the rod 10, carrier member 11, cap member 13 and formed tube 15 are heated at a temperature of about 1250° C. for about 10 minutes while a flow of hydrogen is passed thereabout at a rate of about 250 l/h. This procedure allows tube 15 to be easily pulled off of the carrier member without damage.

Figure 2:
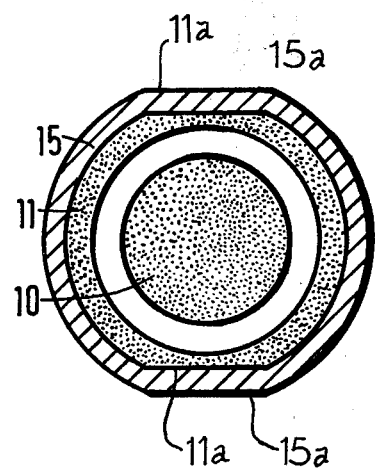
FIG. 2 is a cross-sectional view taken substantially along lines II—II of FIG. 1.

FIG. 2 shows a cross-section of such an arrangement prior to separation of tube 15 from carrier member 11.

Figure 3:
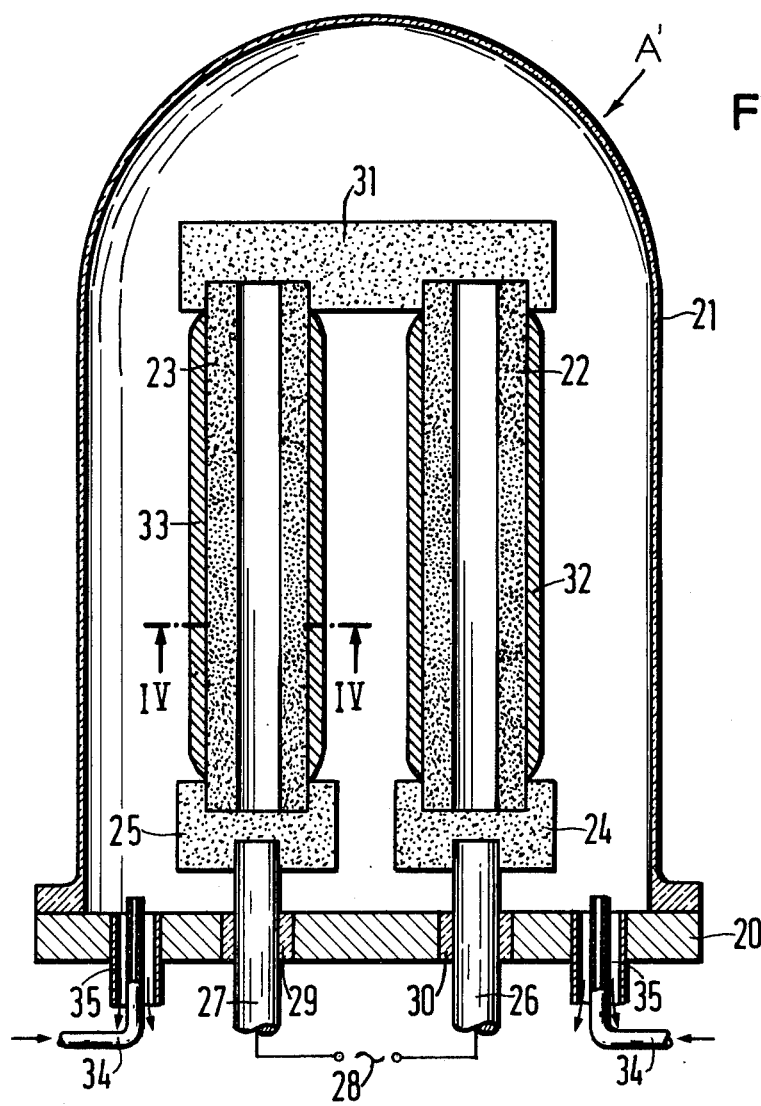
FIG. 3 is a view somewhat similar to that of FIG. 1 of another embodiment of a device useful in producing flattened tubes in accordance with the principles of the invention.

FIG. 3 illustrates another device A' useful for carrying out the principles of the invention. The device A' is comprised of a silver base plate 20 joined in a gas impermeable manner to a quartz dome 21. A pair of gas inlet tubes 34 and a pair of gas outlet tubes 35 are provided in the base plate 20 for controlled ingress and egree of a gas to and from the interior of dome 21. A pair of dielectric lead-in ducts 29 and 30 are provided in plate 20 for mounting silver electrodes 26 and 27 as shown. A pair of vertically disposed tube-shaped graphite carrier members 22 and 23 are interconnected to electrodes 26 and 27, respectively, via graphite support members 24 and 25, respectively. A bridging member 31 interconnects the upper portions of carrier members 22 and 23. A voltage source 28 is operationally connected to electrodes 26 and 27.

Figure 4:
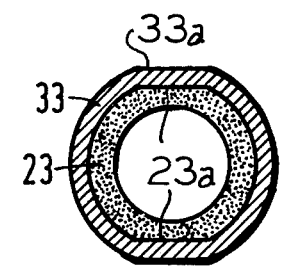
FIG. 4 is a cross-sectional view taken substantially along lines IV—IV of FIG. 3.

The carrier members 22 and 23 are each somewhat ellipsoid in cross-section having flattened side walls 23a (best seen at FIG. 4). If desired, only a single flattened side wall may be provided on a carrier member.

Layers or tubes 32 and 33, for example composed of silicon, are deposited on the periphery of carrier members 22 and 23, respectively, so as to form silicon tubes having a similar shape to that of the carrier members. Deposition occurs from a gas comprised of a mixture containing a molar ratio of silico-chloroform to hydrogen of about 0.1 at a temperature of about 1150° C.

As shown at FIG. 4, the deposited silicon tubes, such as 33, form in a somewhat ellipsoid cross-section with flattened side walls 33a. After the deposition is completed, the carrier members are separated from the formed tubes without destroying the tubes, for example in the manner explained earlier.

Figure 5:
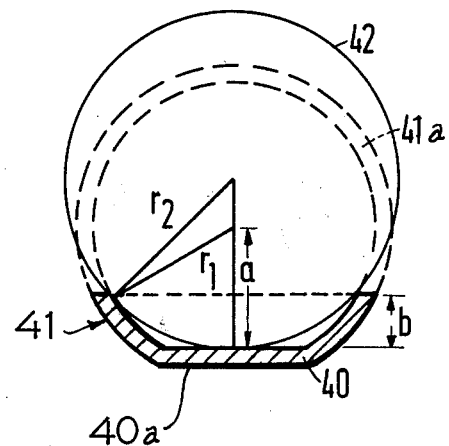
FIG. 5 is an elevated end view, with portions in phantom, of an embodiment of a support structure constructed in accordance with the principles of the invention and supporting a disc thereon.

FIG. 5 illustrates an end view of a support structure 40 formed in accordance with the principles of the invention and supporting a crystal disc 42 thereon with a three-point mounting. The support structure is mechanically processed or cut from a somewhat ellipsoid-shaped tube 41 having a flattened side wall 40a and the cut-out portions of tube 41 are indicated by dotted line 41a. The support structure 40 is cut-out of a tube composed of, for example, silicon, by a diamond saw with appropriate saw cuts in directions perpendicular to parallel to the tube axes.

In preferred embodiments, the support structure 40 is dimensioned in accordance with the following mathematical equation, utilizing the symbols illustrated on the drawings:

$$b = r_1^2 \pm a^2/2(r_2 \pm a)$$

wherein:

$b$ is the height of the structure side walls, $a$ is the dimension of the flattening of the tube, i.e. the distance from the center point of a tube to a flattened side wall thereof, $r_1$ is the inner radius of a tube, $r_2$ is the inner radius of a crystal disc to be supported by the structure.

In a specific example of the above preferred embodiment, $a$ is approximately equal to $0.9r_1$ and $r_1$ is approximately equal to $0.8r_2$.

Figure 6:
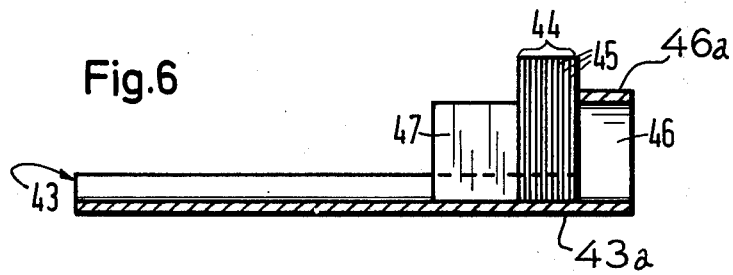
FIG. 6 is an elevated sectional view, with parts in elevation, of another embodiment of a support structure constructed in accordance with the principles of the invention and supporting a plurality of discs thereon.

FIG. 6 illustrates a side view of a support structure 43 having a stack 44 of silicon crystal discs 45 positioned thereon. Structure 43 is produced from a silicon tube having opposite flattened walls, for example, similar to tube 15 shown at FIG. 2. At one end 43a of structure 43, a support strut 46 is provided by leaving that portion of the tube wall standing while cutting out other portions of the tube wall to attain the structure shown. Strut 46 forms a closed arch with a flattened top end 46a inside the support structure 43. It will be noted that the upper surface 46a of strut 46 is above the center of disc 45 so that extremely good support of the disc stack 44 is obtained. The other end of stack 44 may be maintained in position by a movable block member 47 comprised, for example, of a flattened piece of silicon.

Figure 7:
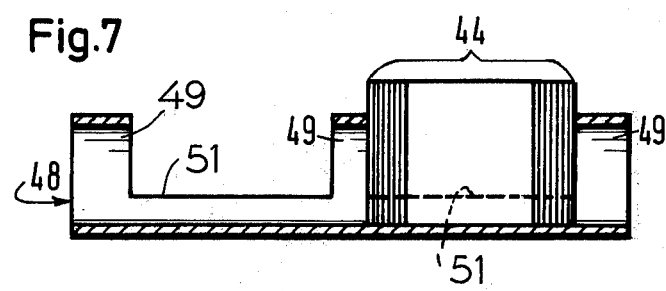
FIG. 7 is a view similar to that of FIG. 6 of yet another embodiment of a support structure constructed in accordance with the principles of the invention and supporting a plurality of discs thereon.

FIG. 7 illustrates a side view of another support structure 48 having a plurality of spaced-apart struts 49 which extend above side walls 51. A stack 44 of crystal discs is arranged between a pair of adjacent struts and is prevented from tipping or the like by the struts.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the spirit and scope of the invention as claimed.

We claim as our invention:

1. A method of producing a support structure having a flat base and upwardly extending side walls integral with said base for supporting generally upright on edge crystal discs of a given diameter during treatment thereof, comprising:

thermally depositing silicon from a gaseous mixture comprises of a carrier gas and a thermally decomposable gaseous silicon compound onto at least one heated cylindrical carrier member, said carrier member having at least one flattened wall portion so as to form a correspondingly shaped tubular member composed of silicon about said carrier member and which tubular member has a flattened wall portion corresponding to that on said carrier member;

disjoining the deposited tubular member from said carrier member without destroying said tubular member;

forming longitudinal separation cuts in said tubular member through two opposing side wall portions thereof adjacent to said flattened wall portion of the tubular member and along lines parallel to a longitudinal axis of said tubular member and at a height dimension above said flattened wall portion of the tubular member but below its wall portion located above said flattened wall portion; and removing the cut-separated portion of the tubular member above said flattened wall portion so as to define a support structure having a flat base corresponding to said flattened wall portion and upwardly extending side walls integral with said flat base and in opposing relation to each other, said side wall having a height dimension ($b$) which is determined by the relation:

$$b = r_1^2 \pm a^2/2(r_2 \pm a)$$

wherein $a$ is the distance from the radial center of said tubular member to the flattened wall portion thereof;

$r_1$ is the dimension of the internal radius of said tubular member; and $r_2$ is the dimension of the crystal discs to be supported by the support structure.

2. A method as defined in claim 1 comprising forming said separation cuts along said given distance which is equal to the length of the tubular member.

3. A method as defined in claim 1 wherein said given distance is less than the length of said tubular member and forming at least one transverse separation cut in said tubular member through said wall portion located above said flattened wall portion thereof and along a line perpendicular to said tube axis for a second given distance less than the diameter dimension of said tubular member and to a meeting with said longitudinal cuts so as to define at least one strut on the support structure integral with the side walls thereof, said strut extending upwardly beyond the periphery of the side walls a distance greater than the radius of the crystal discs to be supported by the support structure.

4. A method as defined in claim 1, wherein said gaseous mixture consists of hydrogen and silico-chloroform and said carrier member is heated to a temperature of about 1100° to 1200° C. so that silicon is deposited on said carrier member at a substantially high deposition rate.

5. A method as defined in claim 1, wherein said deposition is continued until the tube formed on the carrier member has a wall thickness of at least 1 mm.

* * * * *